United States Patent [19]
Looney et al.

[11] Patent Number: 4,661,199
[45] Date of Patent: Apr. 28, 1987

[54] METHOD TO INHIBIT AUTODOPING IN EPITAXIAL LAYERS FROM HEAVILY DOPED SUBSTRATES IN CVD PROCESSING

[75] Inventors: Gary W. Looney, Bordentown; Paul H. Robinson, Lawrenceville, both of N.J.

[73] Assignee: RCA Corporation, Princeton, N.J.

[21] Appl. No.: 797,126

[22] Filed: Nov. 12, 1985

[51] Int. Cl.⁴ ...................... C30B 25/12; C30B 23/00
[52] U.S. Cl. .................................. 156/612; 156/606; 156/613; 156/DIG. 64
[58] Field of Search ............... 156/612, 613, DIG. 64, 156/DIG. 83, 606; 427/93, 94; 118/725, 730

[56] References Cited

U.S. PATENT DOCUMENTS

| | | | |
|---|---|---|---|
| 4,099,041 | 7/1978 | Berkman et al. | 219/10.49 R |
| 4,279,669 | 7/1981 | Braun et al. | 156/613 |
| 4,579,080 | 4/1986 | Martin et al. | 118/152 |

OTHER PUBLICATIONS

Grayson, M., "Encyclopedia of Semiconductor Technology", pp. 381–386, 1984.

Primary Examiner—William R. Dixon, Jr.
Assistant Examiner—Bruce Breneman
Attorney, Agent, or Firm—Joseph S. Tripoli; Donald S. Cohen

[57] ABSTRACT

Heavily doped substrates of silicon wafers are inhibited from contaminating by autodoping phenomenon lightly doped epitaxial growing films by providing a thick film of silicon on the susceptor for CVD processing in an RF powered reactor. The susceptor film of silicon serves to provide a silicon seal to the rear surface of the substrate to prevent or at least inhibit outdiffusion of dopants that can contaminate the epitaxial film. For example, substrates heavily doped with arsenic, phosphorus or boron at concentrations of $10^{19}$ atoms/cc are inhibited from autodoping contaminating epitaxial films of silicon lightly doped with the same dopant at $10^{14}$ atoms/cc.

7 Claims, 4 Drawing Figures

METHOD TO INHIBIT AUTODOPING IN EPITAXIAL LAYERS FROM HEAVILY DOPED SUBSTRATES IN CVD PROCESSING

This invention relates to a method of growing an epitaxial layer on a silicon substrate and, more particularly, a method for growing a lightly doped epitaxial layer on a heavily doped substrate without autogenous contamination.

BACKGROUND OF THE INVENTION

In the production of certain semiconductor devices, an epitaxial layer of silicon on a substrate, such as a silicon wafer, is used as the starting material for the devices. The epitaxial layer of silicon is deposited upon the silicon wafer in a chemical vapor deposition (CVD) process wherein the wafer is supported on a silicon carbide-coated graphite susceptor and heated to a high temperature by energy derived from a radio frequency (RF) source. A volatile mixture of silicon is introduced and thermally decomposed or reacted with other gases or vapors at the surface of the wafer to yield silicon which deposits on the wafer surface. Various types of reactors utilizing such RF heated susceptors are well known in the art. One such susceptor utilized in a barrel reactor is described in U.S. Pat. No. 4,099,041 issued to S. Berkman et al. on Jul. 4, 1978 entitled "Susceptor Structure For Heating Semiconductor Substrates".

In recent applications of semiconductor devices, particularly those used for high power circuits, there has been a need to provide a precise and restricted range of resistivity values of the epitaxial layers grown on heavily doped substrates. For example, substrates heavily doped with arsenic having a dopant concentration greater than $5 \times 10^{19}$ atoms/cc have been used to provide certain types of power devices, such as rectifiers and FETs, in which the epitaxial layer is required to have a lightly doped concentration of $1 \times 10^{14}$ atoms/cc. One problem in the manufacture of such devices is the autogenous contamination that results from the so-called autodoping phenomenon caused by the transfer of the dopant compounds evolved by outdiffusion from the heavily doped substrate into a volatile component form and transferred in such form during the CVD process to the epitaxial layer.

Moreover, it appears that the autodoping effect on individual devices is complicated by cross-contamination doping wherein outdiffused dopants are carried downstream of the input reactant gas flow. The gas is thus contaminated by an increase in its dopant concentration. Eventually the devices downstream of the reactor will receive an epitaxial layer with an increased dopant concentration and thus adversely affect the resistivity of the epitaxial layer.

For the purposes of this description the term "autodoping" is intended to mean the contribution of doping that occurs during the deposition on a doped crystalline substrate of an epitaxial layer derived from dopant products outdiffused from the substrate receiving the epitaxial layer. The term "cross-contamination" is intended to be a form of autodoping in the sense that the cross-contaminating doping products are derived from a different substrate than the substrate receiving the epitaxial layer.

Several attempts have been proposed to reduce the autodoping and cross-contamination effects by, for example, providing on the rear surface of the substrates a sealant coating of oxides of silicon, oxides of silicon nitride and sealant coatings of pure silicon. None of these solutions have been satisfactory or completely successful. Moreover, the extra processing steps of providing such sealant backings to the wafers and, at times, removing them after the epitaxial layer has been deposited, is costly. Attempts to modify the operating parameters of a reactor, such as gas flow, dopant concentration and operating temperatures, have been without success.

There is a need in the art to provide a method for reducing, if not inhibiting, both the autodoping and cross-contamination effects that contaminate epitaxial films during CVD processing.

SUMMARY OF THE INVENTION

According to the present invention, a method for silicon epitaxial growth on a substrate in a reaction chamber by CVD processing includes the step of coating an RF heated susceptor with a coating of silicon having a thickness value to provide by thermal transport sufficient silicon to seal the rear or inner surface of the substrate to inhibit substantially, if not eliminate, outdiffusion of the dopant. In the absence of outdiffused dopants, no autogenous contamination can occur

DETAILED DESCRIPTION OF THE PREFERRED EMBODIMENT OF THE INVENTION

Figure 1:
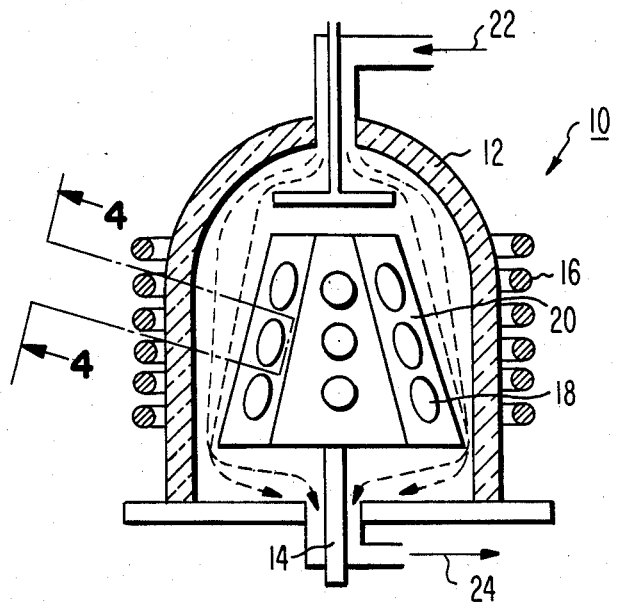
FIGS. 1, 2 and 3 are schematics of typical reactors useful in the practice of the present invention.

Reference is made to FIG. 1 illustrating a barrel type reactor such as that described in detail in U.S. Pat. No. 4,099,041 mentioned hereinabove. The reactor 10 supports a susceptor 20 within a reaction chamber 12 formed of material transparent to RF energy, such as quartz. The susceptor is formed of graphite and coated with silicon carbide of about 0.003 to 0.005 inch thick. The susceptor 20 is suitably supported on a shaft 14 rotated to rotate the susceptor 20. An RF coil 16 is energized by a suitable RF energy source (not shown) to heat the susceptor 20. Several tiers of wafers 18 are carried on the susceptor 20. Three to five tiers carrying four to six wafers at each tier are provided in typical reactors. Gases are provided to the chamber 12 as indicated by arrow 22 and passed over the susceptor 20 and exited as indicated by arrow 24.

In conventional operation, the susceptor 20 is inductively heated by energy from the RF coil 16 to thereby heat the wafers 18 in thermal contact with the susceptor 20. A gaseous mixture, such as silane or chlorosilanes, suitably doped with a conductivity modifier dopant, such as arsenic, phosphorus or boron, is passed over the wafers 18 to effect a deposition of the silicon and dopant from the gaseous mixture to provide a film of epitaxial silicon on the wafers 18.

It is common practice to coat the susceptor 20 with a layer of silicon prior to introducing the wafers 18 into the reactor 10 for epitaxial growth. The layer of silicon applied to the susceptor 20 is used as known in the art to seal the surface of the susceptor 20 and to minimize or at least reduce thereby introduction into the reactor chamber contamination products from the susceptor 20 to the epitaxial film being grown on the wafers 18.

Typically, a film of thickness on the order of 5 to 10 μm of silicon is used on the susceptor 20 for such sealant purposes.

Figure 4:
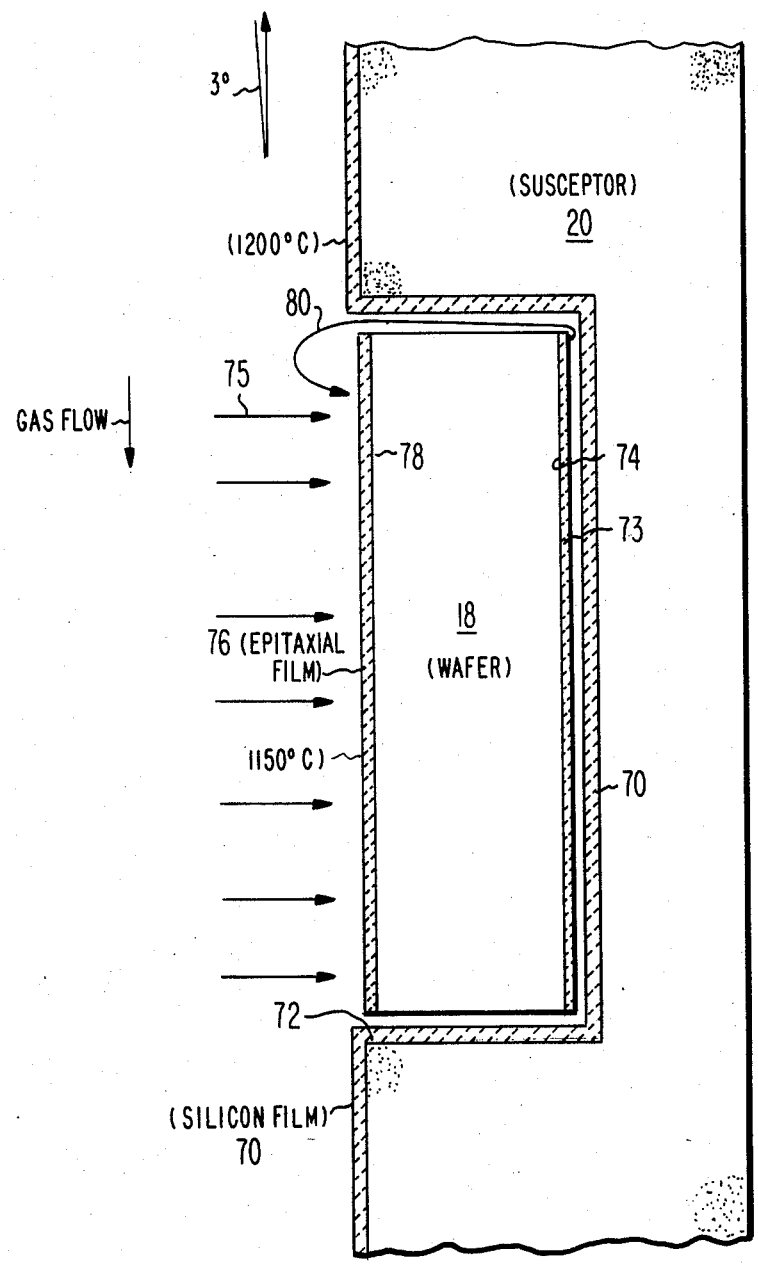
FIG. 4 is a fragmentary section of the susceptor as shown in FIG. 1 illustrating the present invention.

During the epitaxial growth of the film on the wafers 18, it has been found that the silicon from the susceptor 20 is transported to the rear or inner face 74 of the silicon wafers 18 to form a layer 73 of silicon caused by a temperature gradient from the higher temperature of the susceptor 20 to the relatively lower average temperature of the wafers 18. The temperature gradient from the susceptor 20 to the rear surface 74 of the wafer is about 50° C. While such measurements are very difficult to make, an approximate value is made by measurements at the peripheral surface of the susceptor 20 and the outer surface 78 of the wafer 18. For example, as indicated in FIG. 4, a susceptor temperature of 1200° C. existed with a wafer surface (78) temperature of 1150° C. By such measurements, the temperature gradient from the rear surface 74 of the wafer 18 to the front surface 78 is estimated to be within the range of 50° C. to 75° C. assuming the temperature of the susceptor facing the wafer 78 to be about 1250° to 1275° C. In a typical CVD process, a predetermined temperature of the susceptor 20 is operated within a range temperature value of 1150° to 1300° C. while the average temperature of the wafers 18 is within the range of 1100° to 1250° C. The silicon coating of the susceptor 20, in general, provides adequate sealing by silicon layer 73 on the rear face 74 of the substrate during the CVD process and thereby reduces the effects of autodoping when the doping densities of the wafers 18 is no greater than $10^{18}$ atoms/cc and the dopant concentration of the epitaxial film 76 is about $10^{14}$ atoms/cc.

It has been found, however, that as the substrates are more heavily doped at greater dopant concentrations, namely dopant concentrations of $10^{19}$ atoms/cc and greater, the above-explained sealing effect of the silicon layer 73 from the susceptor 20 by thermal transport to the inner face 74 of the wafers 18 has not been effective as we have determined from many experiments. As a result, the autodoping and cross-contamination effects are prevalent in reducing deleteriously the yield of heavily doped quality wafers.

The reduction in yield is due to the deleterious effect that autodoping contamination has on the resistivity of the epitaxial layers. The effect of autodoping is to limit severely the control of predetermined resistivity values of the epitaxial layers. For example, in certain device wafers, it is required that the resistivity be at least within a range of 25 to 50 Ωcm. Heretofore, due to autodoping and cross-contamination effects, the resistivity value of individual wafers in a single batch of 20 wafers has varied from 10 to over 100 Ωcm. The wafers on the top tiers (upstream end of the gas flow) had high resistivity values of 75 to 100 Ωcm, while the wafers on the bottom tiers (downstream end of the gas flow) had low resistivity values below 25 Ωcm. Wafers on the middle tiers could be made to meet a predetermined resistivity value of, for example, 25 to 50 Ωcm, but, it is noted, at the sacrifice of producing wafers at the upper and lower tiers that were unacceptable. The yield of such product is quite low, on the order of 50%.

According to the present invention, the susceptor 20 is provided with a thick coating of silicon to provide by thermal transport sufficient silicon to form a relatively thick layer 73 of silicon to seal the rear or inner surface 74 of a heavily doped substrate to inhibit substantially, if not eliminate, outdiffusion of dopant from the doped substrate 18. We have found that a coating of silicon on the susceptor 20 with a thickness in the range of about 35 μm to about 50 μm provides sufficient silicon for transport to form layer 73 for this purpose. The susceptor 20, it should be noted, is cleaned and resurfaced with a silicon layer 70 before the introduction of subsequent wafers 18 that are to be provided with epitaxial layers. A detailed description of the arrangement of the susceptor 20 will be illustrated by reference to FIG. 4 to be described hereinafter.

Figure 2:
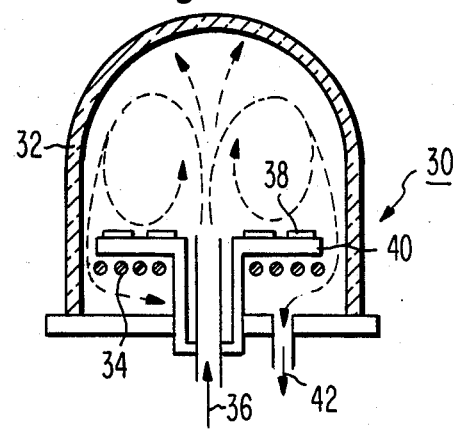

Before proceeding to a detailed description of the invention, reference is made to FIG. 2 showing another form of reactor suitable for use in the practice of the invention. A reactor 30 having a quartz reaction chamber 32 is provided with a susceptor 40 arranged in a horizontal orientation to carry the wafers 38. An RF coil 34 heats the susceptor 40. Gases are passed into the chamber 32 as shown by arrow 36 and exited as shown by arrow 42. The reactor 30 is known as the "pancake" type reactor.

According to the present invention, the susceptor 40 is provided with a thick coating of silicon to seal the susceptor 40 and to provide a transfer of silicon to the wafers 38 as will be described in greater detail with respect to the description of the susceptor 20 as shown in FIG. 1.

Figure 3:
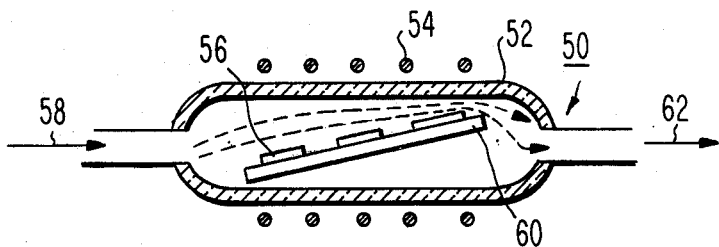

Another reactor 50 is shown in FIG. 3 and is known as the "horizontal" type of reactor. It is provided with a reaction chamber 52 carrying a susceptor 60 that is heated by RF coils 54. The wafers 56 are supported on the susceptor 60. Gases are provided to the reactor 50 as indicated as shown by arrow 58 and exited as shown by arrow 62. The reactor 50 is modified according to the present invention by providing the susceptor 60 with a thick coat of silicon as will be described.

Reference is now made to FIG. 4 which is a fragmentary section of the barrel reactor 10 of FIG. 1 as seen along viewing line 4—4. As seen in FIG. 4, a wafer 18 is positioned on the susceptor 20 within a recess 72. The inner face 74 of the wafer 18, before receiving the silicon layer 73, is thus in thermal contact with the susceptor 20. According to one embodiment of the invention, a film 70 of silicon having a thickness of 40 μm is applied to the outer surface of the susceptor 20. During the CVD process, the chamber 12 of the reactor 10 is purged with a suitable purging gas, such as hydrogen, to purge the chamber 12 of ambient air in preparation for the introduction of the reactant gases. During this preliminary purging step, the RF coils 16 are energized to heat, by induction, the susceptor 20 which in turn heats the wafer 18. Thereafter, a reactant gas 75 is added to the hydrogen and applied to the reactor 10, as shown by arrows, to provide a layer 76 of epitaxial silicon.

According to one embodiment of the present invention, the wafer 18 is an N-type silicon that is heavily doped with arsenic with a dopant concentration of $5 \times 10^{19}$ atoms/cc. The reactant silicon-containing gas 75 is doped with arsenic to provide a doping concentration of $1 \times 10^{14}$ atoms/cc in the epitaxial layer 76. During the process of developing the epitaxial layer 76 in conventional susceptors 20 with a coating of silicon in the range of 5 to 10 μm, arsenic is evolved by outdiffusion from the inner face 74 of the wafer 18 in the form of a volatile arsenic component that is transported to the relatively lower temperature of the front surface 78 of the wafer 18 along, for example, a path as indicated by arrow 80. The transported arsenic is then co-mingled with the arsenic dopant of the reactant gas 75 to contaminate the doping of the epitaxial layer 76 by increasing the desired dopant concentration. As a result, inconsistent values of the resistivity of the respective epitaxial layers 76 reduces the product wafer yield, as explained above.

It will be noted that arsenic is not outdiffused from the front surface 78 at the same rate as the outdiffusion of arsenic for the rear surface 74 for two reasons. First, the temperature at the surface 78 is cooler, by 50° to 75° C., than the temperature of the rear surface 74. Second, the surface 78 is being coated and thus sealed by the epitaxial layer 76 to prevent outdiffusion of the dopants in the front surface portions of the substrate.

According to the present invention, by providing a film 70 of silicon having a thickness within the range of about 35 to about 50 $\mu$m, we have discovered that the autodoping phenomenon is reduced, if not completely suppressed. Moreover, the cross-contamination effects are completely suppressed. Experimental data has shown that the resistivity of the epitaxial layer 76 in a batch of wafers positioned on all positions of a four-tier susceptor is substantially constant and within a range of 25 to 35 $\Omega$cm. The yield of the wafer product made according to the present invention has been substantially 100% at the desired resistivity values. This, it should be noted, is a significant improvement over the prior art techniques in which the susceptors were provided with silicon sealant coatings of 5 to 10 $\mu$m. The yields of the prior art have been about 50%, as explained above.

Experiments have shown by scanning electron micrographs that the silicon layer 73 formed according to the conventional prior art process wherein the susceptor silicon layer 70 is less than 20 $\mu$m, indicate a clearly observable poor coating by layer 73 of the rear substrate surface 74 allowing thereby outdiffusion of dopant. Similar micrographs of a silicon layer 73 formed according to the present invention wherein the susceptor silicon layer 73 is 40 $\mu$m, indicate a clearly observable good coating by layer 73 of the substrate surface 74, preventing thereby outdiffusion of dopant.

We have not determined the precise thickness of a film of silicon 70 that is needed on the susceptor to overcome the autodoping effects. However, we have observed that all the silicon of the silicon layer 70 facing the rear surface 74 of the wafers has been removed. In view of these observations, we thus assumed that the silicon of the film 70 has been transported to the inner surface 74 of the substrate during the epitaxial deposition process as a layer 73 of silicon. In all our experiments in which there has been a 100% yield in the product wafers, all of the silicon on the susceptor facing the substrates has apparently been transferred to the substrates as a layer 73.

According to the present invention, boron may also be used as the conductivity modifier material with the same ranges of dopant densities. Thus, when the boron is to be used as the dopant for P-type material for the wafer and epitaxial layer, the wafer will have a boron-silicon wafer doped at $10^{19}$ atoms/cc and the epitaxial layer will be grown with a reactant gas doped with boron to produce an epitaxial layer doped with boron at $10^{14}$ atoms/cc. Phosphorus may be used to provide N-type material with comparable dopant densities.

Our experimental studies of devices made in accordance with the invention show that the product yield is effectively 100% for thickness of the silicon film 70 on the susceptor 20 at 40 $\mu$m. Thickness values of about 20 $\mu$m, however, have failed to provide a 100% yield in the desired resistivity of the epitaxial film 76.

It should be appreciated that the invention is, in general, useful for epitaxial deposition on a heavily doped substrate ($10^{19}$) using a lightly doped gas ($10^{14}$) wherein the dopant concentration ratio is about 100,000:1. In the prior art, this ratio has been considered a formidable problem to confront without expecting autodoping effects. The present invention provides a solution to that problem.

We Claim:

1. In a method for silicon epitaxial growth in a reaction chamber by chemical vapor deposition (CVD) of silicon material deposited epitaxially on one surface of a substrate of a crystalline silicon material heavily doped with a volatile component which will outdiffuse during the deposition, which substrate is in thermal contact with a susceptor inductively heated by radio frequency (RF) energy, improvement comprising the steps of:
   (a) providing a film of silicon on said susceptor having a thickness of at least about 35 $\mu$m to provide by thermal transport sufficient silicon to seal the other surface of said substrate to inhibit substantially if not eliminate outdiffusion of the dopant from said other surface while still leaving a film of silicon on the surface of the susceptor which is thick enough to seal the surface and prevent outdiffusion of contamination products from the susceptor;
   (b) positioning at least one of said substrates on said susceptor with said other surface being in close proximity and in thermal contact with said surface of the susceptor to receive epitaxially a deposition of lightly doped silicon on said one surface;
   (c) passing a purging gas over said substrate;
   (d) passing a reactant gas containing silicon and being lightly doped with a conductivity modifier material over said substrate to deposit epitaxially a layer of said lightly doped silicon on said one substrate surface, whereby silicon from said film of silicon on said susceptor is transported to the other surface of said substrate adjacent said silicon film to seal said other substrate surface from outdiffusion and thereby inhibiting volatile components of said dopant of conductivity modifier material from being outdiffused from said susceptor to thereby maintain the dopant concentration of said epitaxial layer at a value closer than when out diffusion is not inhibit.

2. The method of claim 1 wherein said film of silicon on said susceptor is within the range about 35 to 50 $\mu$m in thickness.

3. The method of claim 1 wherein said dopant is arsenic.

4. The method in claim 1 wherein said dopant is boron.

5. The method in claim 1 wherein said dopant is phosphorous.

6. The method of claim 1 wherein the ratio of dopant concentration of said substrate to the dopant concentration of said epitaxial layer is about 100,000:1.

7. The method of claim 1 wherein the dopant concentration of said substrate is about $1-5\times10^{19}$ atoms/cc and the dopant concentration of said epitaxial layer is about $1\times10^{14}$ atoms/cc.

* * * * *